United States Patent
Pickett et al.

(10) Patent No.: US 10,863,637 B1
(45) Date of Patent: Dec. 8, 2020

(54) ADJUSTABLE FACIAL-INTERFACE SYSTEMS FOR HEAD-MOUNTED DISPLAYS

(71) Applicant: FACEBOOK TECHNOLOGIES, LLC, Menlo Park, CA (US)

(72) Inventors: David Michael Pickett, Seattle, WA (US); Scott Andrew Dallmeyer, Seattle, WA (US); Peter Wesley Bristol, Seattle, WA (US)

(73) Assignee: Facebook Technologies, LLC, Menlo Park, CA (US)

( * ) Notice: Subject to any disclaimer, the term of this patent is extended or adjusted under 35 U.S.C. 154(b) by 349 days.

(21) Appl. No.: 15/730,679

(22) Filed: Oct. 11, 2017

(51) Int. Cl.
*H05K 5/02* (2006.01)
*H05K 5/00* (2006.01)
*G06F 1/16* (2006.01)

(52) U.S. Cl.
CPC .......... *H05K 5/0204* (2013.01); *G06F 1/163* (2013.01); *H05K 5/0017* (2013.01)

(58) Field of Classification Search
CPC .... G06F 1/163; H05K 5/0017; H05K 5/0086; H05K 5/0217; G02B 27/017; G02B 27/01; G02B 27/0172; G02B 27/0176; G02B 27/0149; G02B 27/0154; G02B 27/0161
See application file for complete search history.

(56) References Cited

U.S. PATENT DOCUMENTS

| | | | | |
|---|---|---|---|---|
| D834,017 | S * | 11/2018 | Beynel | ........................ D14/372 |
| 10,251,292 | B2 * | 4/2019 | Araki | .................... H04N 5/7491 |
| 2013/0250503 | A1 * | 9/2013 | Olsson | ...................... G02C 5/02 361/679.03 |
| 2013/0342981 | A1 * | 12/2013 | Cox | ........................ G06F 3/017 361/679.01 |
| 2014/0153173 | A1 * | 6/2014 | Pombo | .................... G06F 1/163 361/679.03 |
| 2017/0337737 | A1 * | 11/2017 | Edwards | ................ F16M 13/04 |
| 2018/0003984 | A1 * | 1/2018 | Lai | ...................... G02B 27/0176 |
| 2018/0295733 | A1 * | 10/2018 | Wen | ...................... H05K 5/0017 |

* cited by examiner

*Primary Examiner* — Anthony M Haughton
(74) *Attorney, Agent, or Firm* — FisherBroyles, LLP

(57) ABSTRACT

A facial-interface system for a head-mounted-display device may include a facial interface and a facial-interface adjustment apparatus. The facial-interface adjustment apparatus may include (1) an interface-mounting member for mounting the facial-interface adjustment apparatus to a display housing, and (2) a pivot member coupled to the facial interface and rotatably coupled to the interface-mounting member such that that the facial interface is rotatable between a plurality of positions relative to the interface-mounting member. A head-mounted-display device may include a facial interface, a display housing, and a facial-interface adjustment apparatus. The facial-interface adjustment apparatus may include (1) an interface-mounting member disposed in an interior of the display housing, and (2) a pivot member coupled to the facial interface and rotatably coupled to the interface-mounting member such that that the facial interface is rotatable between a plurality of positions relative to the display housing. Various other apparatuses, systems, and methods are also disclosed.

20 Claims, 6 Drawing Sheets

ADJUSTABLE FACIAL-INTERFACE SYSTEMS FOR HEAD-MOUNTED DISPLAYS

BACKGROUND

Putting on a virtual reality headset may be the beginning of a thrilling experience, one that may be more immersive than almost any other digital entertainment or simulation experience available today. Virtual reality headsets may enable users to travel through space and time, interact with friends in a three-dimensional world, or play video games in a radically redefined way. Virtual reality headsets may also be used for purposes other than recreation-governments may use them for military training simulations, doctors may use them to practice surgery, and engineers may use them as visualization aids.

Conventional virtual reality headsets often include cushioned facial interfaces that allow users to position the headsets on their faces. However, any one facial interface may not comfortably fit users having various head or face sizes and shapes. Unfortunately, in order to adjust the fit of a facial interface, users must typically remove the facial-interface cushion or the entire facial interface and replace it with a facial-interface cushion or facial interface of a different size to obtain a desired fit. Accordingly, users often cannot properly adjust the fit of a headset without having a replacement facial interface or interface cushion available.

SUMMARY

As will be described in greater detail below, the instant disclosure generally relates to adjustable facial-interface systems for head-mounted-displays devices, head-mounted-display devices, and methods for assembling adjustable facial-interface systems. In one example, a facial-interface system for a head-mounted-display device may include a facial interface and a facial-interface adjustment apparatus. The facial-interface adjustment apparatus may include (1) an interface-mounting member for mounting the facial-interface adjustment apparatus to a display housing, and (2) a pivot member coupled to the facial interface and rotatably coupled to the interface-mounting member such that that the facial interface is rotatable between a plurality of positions relative to the interface-mounting member.

In some embodiments, the facial interface may include an upper region dimensioned to abut a user's forehead and a lower region dimensioned to abut the user's nose. The pivot member may be coupled to the facial interface at a location between the upper region and the lower region. In at least one embodiment, the pivot member may be coupled to the facial interface at the lower region. The pivot member may include a protrusion that extends into a recess defined in the interface-mounting member. Additionally or alternatively, the interface-mounting member may include a protrusion that extends into a recess defined in the pivot member.

According to some embodiments, the facial interface may include an interface cushion dimensioned to abut a user's face and a back piece protruding away from the interface cushion. The pivot member may be coupled to the back piece. In this example, the back piece of the facial interface may include an inner surface facing toward a viewing region and an outer surface facing away from the viewing region and the pivot member may extend from the outer surface of the back piece.

According to at least one embodiment, the facial-interface system may include two facial-interface adjustment apparatuses. Each of the two facial-interface adjustment apparatuses may include (1) an interface-mounting member for mounting the facial-interface adjustment apparatus to the display housing, and (2) a pivot member coupled to a corresponding interface-mounting member. In this example, the pivot members of the two facial-interface adjustment apparatuses may each extend from opposite facing surface portions of the interface-mounting member.

A corresponding head-mounted-display device may include (1) a facial interface, (2) a display housing, and (3) a facial-interface adjustment apparatus. The facial-interface adjustment apparatus may include (1) an interface-mounting member disposed in an interior of the display housing, and (2) a pivot member coupled to the facial interface and rotatably coupled to the interface-mounting member such that that the facial interface is rotatable between a plurality of positions relative to the display housing. An upper region of the facial interface may be rotatable toward the display housing in conjunction with rotation of a lower region of the facial interface away from the display housing.

In some embodiments, the head-mounted-display device may include a resilient light-blocking layer coupled to a back piece of the facial interface. The head-mounted-display device may also include a display viewing lens, and the resilient light-blocking layer may extend between the back piece of the facial interface and the display viewing lens. The resilient light-blocking layer may include a resilient fabric layer.

In at least one embodiment, the head-mounted-display may further include two facial-interface adjustment apparatuses. Each of the two facial-interface adjustment apparatuses may include (1) an interface-mounting member coupled to an interior surface portion of the display housing, and (2) a pivot member coupled to a corresponding interface-mounting member. In this example, the pivot members of the two facial-interface adjustment apparatuses may be rotatable about a common axis of rotation relative to the interface-mounting members. A corresponding method may include (1) positioning at least a portion of a facial interface within a display housing of a head-mounted-display device such that a pivot member coupled to the facial interface is disposed within the display housing, and (2) rotatably coupling the pivot member to an interface-mounting member disposed in an interior of the display housing such that the facial interface is rotatable between a plurality of positions relative to the display housing.

A corresponding method may include positioning an adjustment protrusion of an adjustment lever within an adjustment groove defined by an extending member of a facial-interface adjustment apparatus for a head-mounted-display device such that (1) the adjustment lever is rotatable about a pivot to move the adjustment protrusion along the adjustment groove, and (2) the extending member is movable between a contracted holding position and an extended holding position by the adjustment protrusion as the adjustment protrusion moves along the adjustment groove. The method may also include coupling a facial interface to a mounting portion of the extending member. In some examples, the method may include coupling the facial-interface adjustment apparatus to a head-mounted-display device.

Features from any of the above-mentioned embodiments may be used in combination with one another in accordance with the general principles described herein. These and other embodiments, features, and advantages will be more fully understood upon reading the following detailed description in conjunction with the accompanying drawings and claims.

BRIEF DESCRIPTION OF THE DRAWINGS

The accompanying drawings illustrate a number of exemplary embodiments and are a part of the specification. Together with the following description, these drawings demonstrate and explain various principles of the instant disclosure.

Figure 1:
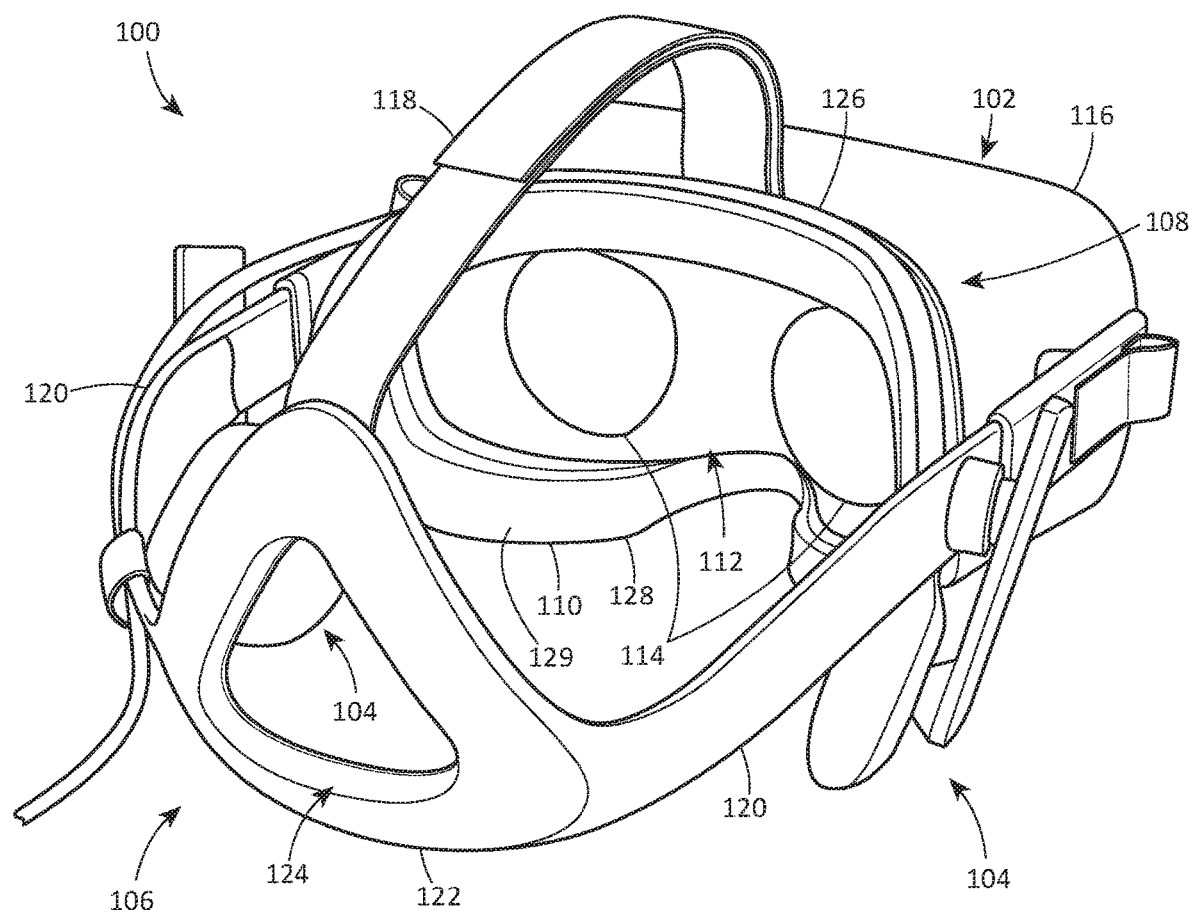
FIG. 1 is a perspective view of an exemplary head-mounted-display system in accordance with some embodiments.

Throughout the drawings, identical reference characters and descriptions indicate similar, but not necessarily identical, elements. While the exemplary embodiments described herein are susceptible to various modifications and alternative forms, specific embodiments have been shown byway of example in the drawings and will be described in detail herein. However, the exemplary embodiments described herein are not intended to be limited to the particular forms disclosed. Rather, the instant disclosure covers all modifications, equivalents, and alternatives falling within the scope of the appended claims.

DETAILED DESCRIPTION OF EXEMPLARY EMBODIMENTS

The present disclosure describes various adjustable facial-interface systems for head-mounted displays, head-mounted-display devices, and methods for assembling adjustable facial-interface systems. As will be explained in greater detail below, embodiments of the instant disclosure may include facial-interface systems having facial-interface adjustment apparatuses that enable users to quickly and easily adjust facial interfaces. The facial-interface adjustment apparatus may include a pivot member that enables rotation of the facial-interface with respect to a display housing and a display viewing region. For example, the facial-interface adjustment apparatus may include a pair of pivot members disposed on opposite sides of the facial interface. The pivot members may be rotatably coupled to corresponding interface-mounting members so that the pivot members rotate about a common axis. The facial interface may automatically rotate and adjust to a user's unique facial contours as the user places the facial interface against his or her face and tightens a holding strap assembly to secure the head-mounted-display device to the user's head. The facial interface may also include an interface cushion that comfortably conforms to the user's facial features.

In some embodiments, the head-mounted-display device may include a resilient light-blocking layer, such as a resilient fabric layer, that extends between the facial interface and display-viewing lenses of the head-mounted-display. The resilient light-blocking layer may flex and stretch as the facial-interface is moved between various positions with respect to the display-viewing lenses, ensuring that external light is blocked from entering a user viewing region of the head-mounted-display device during use. Accordingly, the facial-interface systems may allow users to automatically adjust and comfortably wear head-mounted displays without having to replace the facial interfaces and/or interface cushions. The facial-interface systems may also provide users with an optimal viewing position for viewing display regions of the head-mounted displays, ensuring a high-quality viewing experience for the user.

The following will provide, with reference to FIGS. 1-4, examples of head-mounted-display systems including adjustable facial-interface systems. In addition, the discussion corresponding to FIGS. 5A-7 will provide examples of head-mounted-display devices including adjustable facial-interface systems. Finally, the discussion corresponding to FIG. 8 will provide examples of methods for assembling adjustable facial-interface systems.

FIG. 1 is a perspective view of a head-mounted-display system 100 in accordance with some embodiments. In some embodiments, head-mounted-display system 100 may include a head-mounted-display device 102 (i.e., head-mounted display), audio subsystems 104, a strap assembly 106, and a facial-interface system 108. The terms "head-mounted display" and "head-mounted-display device," as used herein, generally refer to any type or form of display device or system that is worn on or about a user's head and displays visual content to the user. Head-mounted displays may display content in any suitable manner, including via a screen (e.g., an LCD or LED screen), a projector, a cathode ray tube, an optical mixer, etc. Head-mounted displays may display content in one or more of various media formats. For example, a head-mounted display may display video, photos, and/or computer-generated imagery (CGI). Head-mounted-display device 102 may include a display housing 116 surrounding various components of head-mounted-display device 102, including display-viewing lenses 114 and various electronic components, including display components as described above.

Head-mounted displays may provide diverse and distinctive user experiences. Some head-mounted displays may provide virtual-reality experiences (i.e., they may display computer-generated or pre-recorded content), while other head-mounted displays may provide real-world experiences (i.e., they may display live imagery from the physical world). Head-mounted displays may also provide any mixture of live and virtual content. For example, virtual content may be projected onto the physical world (e.g., via optical or video see-through), which may result in augmented reality or mixed reality experiences. Head-mounted displays may be configured to be mounted to a user's head in a number of ways. Some head-mounted displays may be incorporated into glasses or visors. Other head-mounted displays may be incorporated into helmets, hats, or other headwear. Examples of head-mounted displays may include OCULUS RIFT, GOOGLE GLASS, VIVE, SAMSUNG GEAR, etc.

Embodiments of the invention may include or be implemented in conjunction with an artificial reality system. Artificial reality is a form of reality that has been adjusted in some manner before presentation to a user, which may include, e.g., a virtual reality (VR), an augmented reality (AR), a mixed reality (MR), a hybrid reality, or some combination and/or derivatives thereof. Artificial reality content may include completely generated content or generated content combined with captured (e.g., real-world) content. The artificial reality content may include video, audio, haptic feedback, or some combination thereof, and any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, e.g., create content in an artificial reality and/or are otherwise used in (e.g., perform activities in) an artificial reality. The artificial reality system that provides the artificial reality content may be implemented on various platforms, including a head-mounted display (HMD) connected to a host computer system, a standalone HMD, a mobile device or computing system, or any other hardware platform capable of providing artificial reality content to one or more viewers.

In some embodiments, audio subsystems 104 may be integrated with head-mounted-display device 102 and may provide audio signals to the user's ears. Head-mounted-display system 100 may, for example, have two audio subsystems 104 located on the left and right sides of head-mounted-display system 100 to provide audio signals to the user's left and right ears, as shown in FIG. 1.

Strap assembly 106 may be used for adjustably mounting head-mounted-display device 102 on the user's head. As shown in FIG. 1, strap assembly 106 may include an upper strap 118 and lower straps 120, that are coupled to head-mounted-display device 102 to adjustably conform to the top and/or sides of the user's head when the user is wearing head-mounted-display device 102. In some embodiments, strap assembly 106 may include a back piece 122 coupled with upper strap 118 and lower straps 120 to rest against the back of the user's head (e.g., around the user's occipital lobe). In at least one embodiment, back piece 122 may include a back-piece opening 124 that is dimensioned and positioned to securely fit around a back portion (e.g., a portion of the user's occipital lobe) of the user's head.

In some embodiments, facial-interface system 108 may be configured to comfortably rest against a region of the user's face, including a region surrounding the user's eyes, when head-mounted-display system 100 is worn by the user. In these embodiments, facial-interface system 108 may include an interface cushion 128 that is coupled to an interface body 126. Facial-contact surface 129 of interface cushion 128 may be configured to rest against portions of the user's face (e.g., at least a portion of the user's nasal, cheek, temple, and/or forehead facial regions). Interface cushion 128 and interface body 126 may surround a viewing region 112 that includes the user's field of vision, allowing the user to look through display-viewing lenses 114 of head-mounted-display device 102 without interference from outside light while the user is wearing head-mounted-display system 100.

Figure 2:
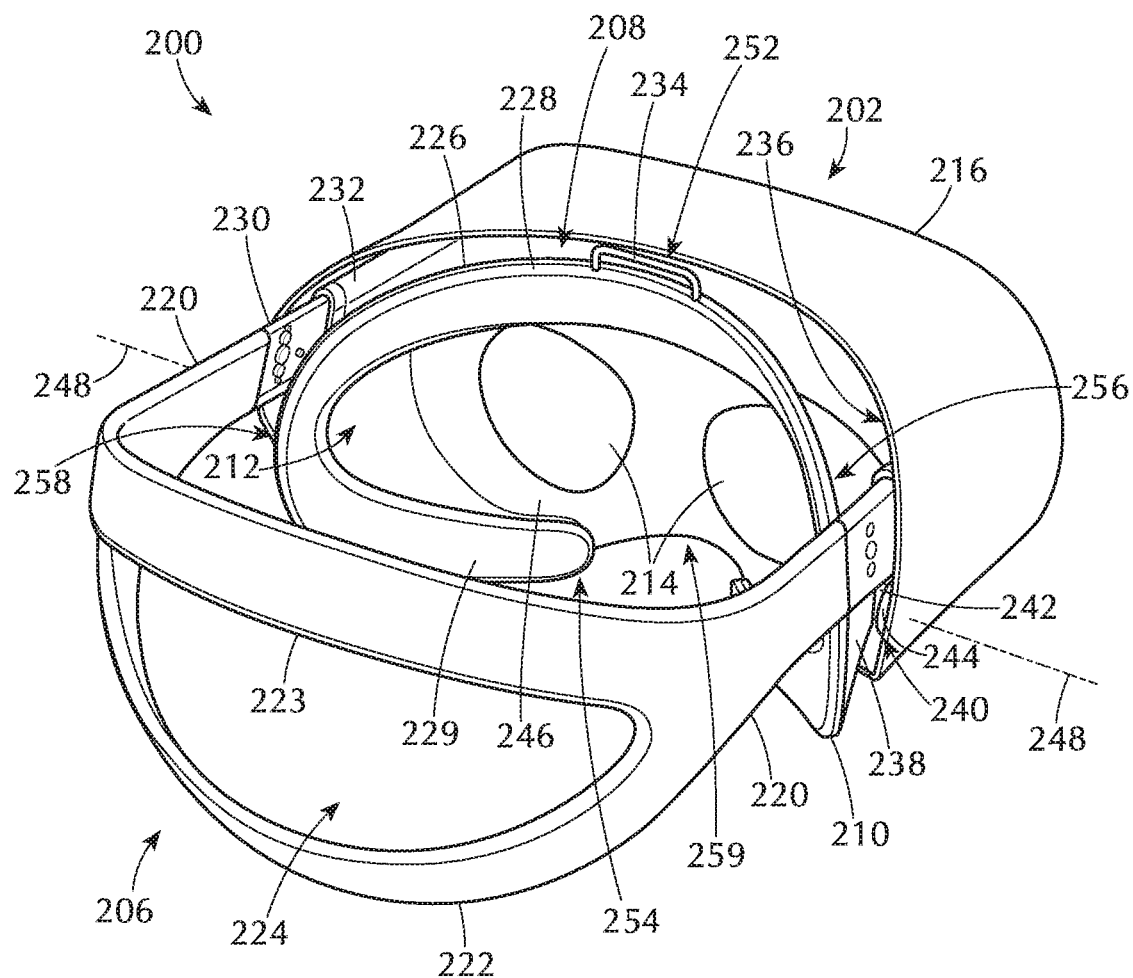
FIG. 2 is a perspective view of an exemplary head-mounted-display system in accordance with some embodiments.

FIG. 2 is a perspective view of a head-mounted-display system 200 in accordance with some embodiments. Head-mounted-display system 200 may include a head-mounted-display device 202, a strap assembly 206, and a facial-interface system 208. Although not illustrated in FIG. 2, head-mounted-display system 200 may include audio subsystems (see, e.g., audio subsystems 104 shown in FIG. 1) to provide audio signals to the user's ears. Strap assembly 206 may include an upper strap (see, e.g., upper strap 118 shown in FIG. 1), lower straps 220, a lower back-strap portion 222, and an upper back-strap portion 223. Lower back-strap portion 222 and upper back-strap portion 223 may define a back opening 224 that is dimensioned and positioned to securely fit around a back portion (e.g., a portion of the user's occipital lobe) of the user's head. The upper strap and lower straps 220 may be adjustable to fit various user head sizes and shapes.

Figure 3:
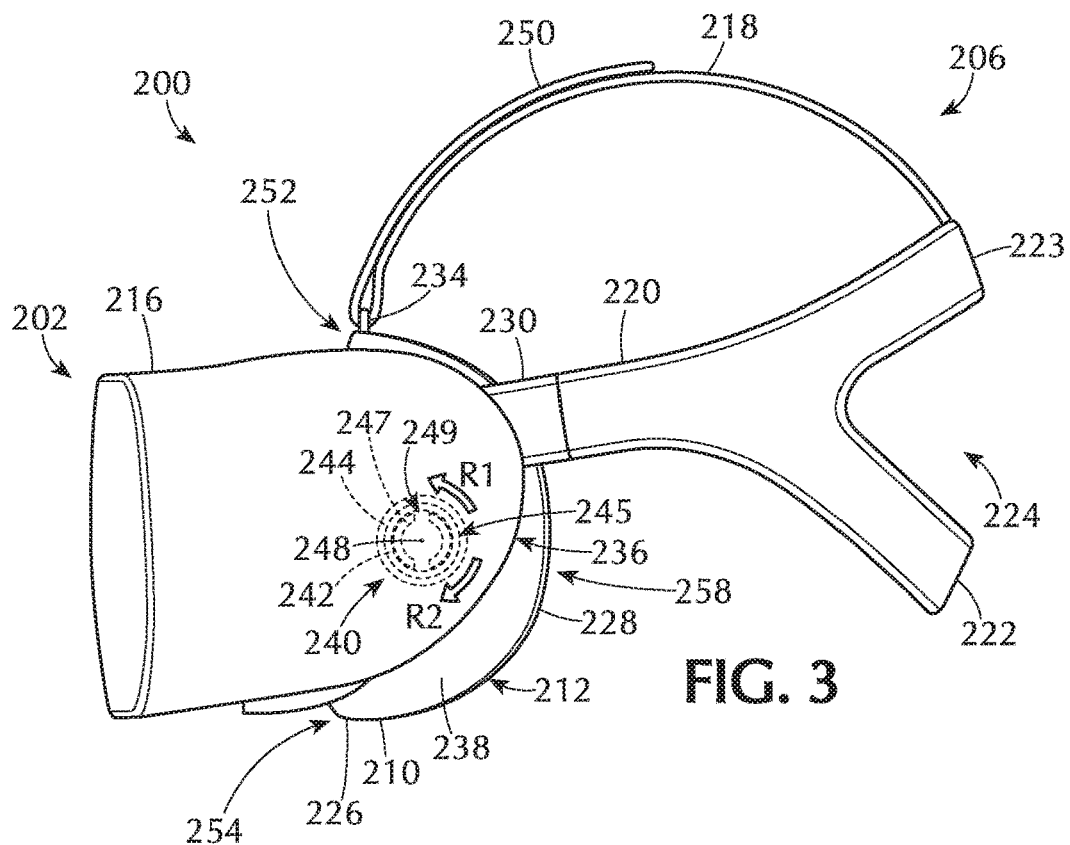
FIG. 3 is a side view of an exemplary head-mounted-display system in accordance with some embodiments.
Figure 4:
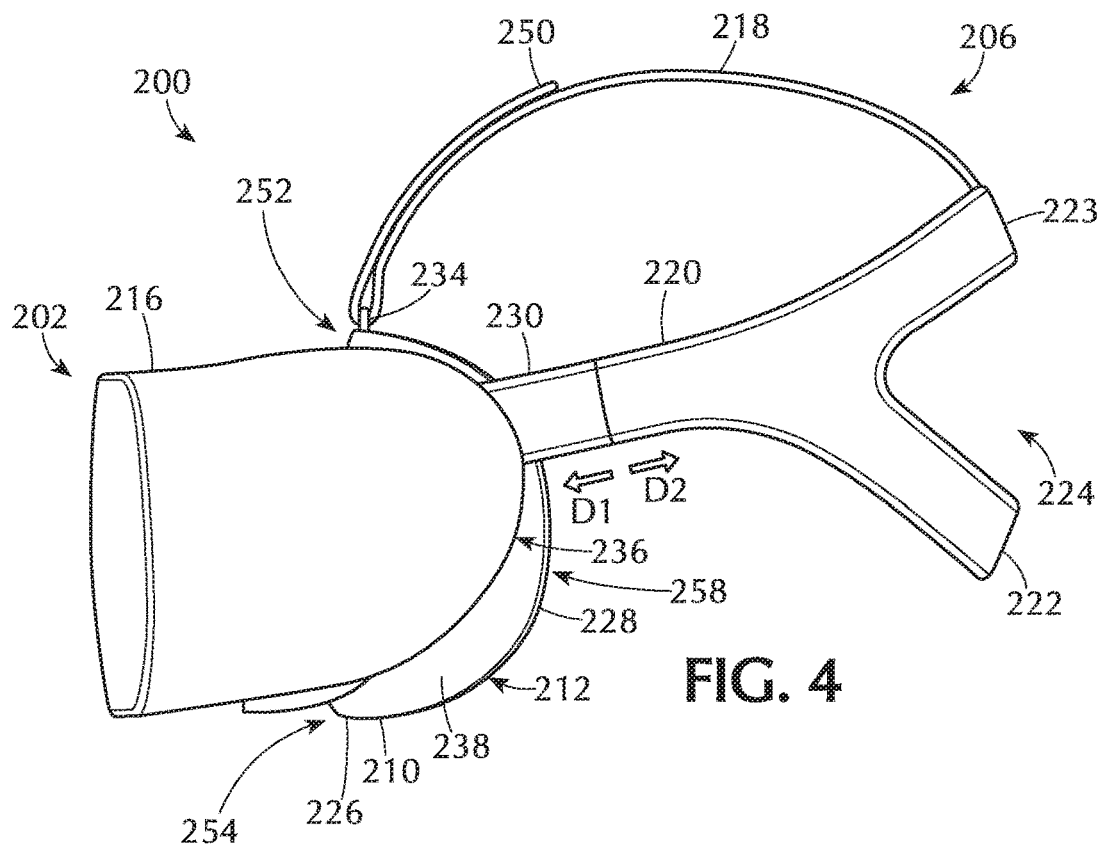
FIG. 4 is a side view of an exemplary head-mounted-display system in accordance with some embodiments.

In at least one embodiment, lower straps 220 may each include a strap-adjustment member 230 that is coupled to head-mounted-display device 202 at a strap-holding member 232. For example, each strap-adjustment member 230 may be at least partially disposed within a corresponding strap-holding member 232. Strap-holding members 232 may be at least partially disposed within display housing 216, as shown in FIG. 2. For example, strap-holding members 232 may be mounted to portions of an interior surface 236 of display housing 216. Additionally or alternatively, strap-holding members 232 may be disposed on exterior portions of display housing 216. Each strap-adjustment member 230 may be movable between a plurality of positions with respect to strap-holding member 232 to move strap assembly 206 toward and away from head-mounted-display device 202, allowing for placement of head-mounted-display system 200 on a user's head and subsequent tightening of strap assembly 206 to securely mount head-mounted-display system 200 around the user's head. In some embodiments, each strap-adjustment member 230 may be locked in a desired position relative to head-mounted-display device 202. According to at least one embodiment, facial interface 110 may include a strap-attachment loop 234 for coupling a portion of an upper strap (see, e.g., upper strap 218 shown in FIGS. 3 and 4) to facial interface 110. Additionally or alternatively, the upper strap may be coupled to an upper portion of display housing 216. An opposite end of the upper strap may be coupled to upper back-strap portion 223, as shown in FIGS. 3 and 4.

As will be described in greater detail below, facial interface 210 of facial-interface system 208 may be rotatably adjustable to comfortably rest against the user's face and to provide an optimal display viewing position for the user. Facial interface 210 may include an interface cushion 228 that is coupled to an interface body 226. Interface cushion 228 and interface body 226 of facial interface 210 may surround a viewing region 212 that includes the user's field of vision, allowing the user to look through display-viewing lenses 214 of head-mounted-display device 202 without interference from outside light while the user is wearing head-mounted-display system 200. In some embodiments, facial-interface system 208 may include a resilient light-blocking layer 246 extending between portions of facial interface 210 and display-viewing lenses 214. For example, resilient light-blocking layer 246 may extend between rear portions of interface body 226 and display-viewing lenses 214. Resilient light-blocking layer 246 may prevent external light from entering viewing region 212 when facial interface 210 is disposed against the user's face. Resilient light-blocking layer 246 may be formed of a resilient material, such as a resilient fabric, having elasticity such that resilient light-blocking layer 246 flexes and/or stretches in conjunction with movement of facial interface 210.

Facial-contact surface 229 of interface cushion 228 may be configured to rest against selected portions of the user's face, including a region surrounding the user's eyes (e.g., at least a portion of the user's nasal, cheek, temple, and/or forehead facial regions), when head-mounted-display system 200 is worn by the user. Facial interface 210 may include an upper region 252 corresponding to a forehead region of the user's face, a lower region 254 corresponding to nasal and cheek regions of the user's face, a right-side region 256 corresponding to a right temple region of the user's face, and a left-side region 258 corresponding to a left temple region of the user's face. In some embodiments, facial interface 210 may include a nasal region 259 for surrounding and/or abutting a user's nose. For example, as shown in FIG. 2, nasal region 259 may include a concave surface or gap defined between adjacent portions of interface body 226 and/or interface cushion 228 at lower region 254, with a portion of resilient light-blocking layer 246 extending between the adjacent portions of interface body 226. In some embodiments, nasal region 259 may include a concave portion of interface body 226 and/or interface cushion 228 (see, e.g., FIG. 1).

At least a portion of facial interface 210, including at least a portion of interface body 226, may be at least partially surrounded by at least a portion of display housing 216. In some embodiments, interface body 226 of facial interface 210 may include a back piece 238 that protrudes away from interface cushion 228 toward an interior of display housing 216 (e.g., an interior cavity defined in display housing 216 by an interior surface 236). Back piece 238 may at least partially surround viewing region 212 and may block external light from entering viewing region 212. As shown in FIG. 2, inward facing surface portions of back piece 238 may face viewing region 212 and outward facing surface portions of back piece 238 may face toward portions of interior surface 236 of display housing 216. Facial interface 210 may be positioned such that facial interface 210 is spaced apart from display housing 216, allowing for movement of facial interface 210 with respect to display housing 216.

Facial-interface system 208 may include at least one facial-interface adjustment apparatus 240 for rotatably adjusting the position of facial interface 210 with respect to portions of head-mounted-display device 202, including display housing 216, display-viewing lenses 214, and/or any other components of head-mounted-display device 202 (including display components). For example, facial-interface system 208 may include two facial-interface adjustment apparatuses 240 positioned at right and left sides of head-mounted-display device 202. Additionally or alternatively, one or more facial-interface adjustment apparatuses 240 may be disposed at any other suitable portion of head-mounted-display device 202, without limitation. In at least one embodiment, a facial-interface adjustment apparatus 240 may be disposed between back piece 238 of facial interface 210 and display housing 216 at each of right-side region 256 and left-side region 258 of facial interface 210. FIG. 2, for example, shows a facial-interface adjustment apparatus 240 disposed between a right-side region of display housing 216 and back piece 238 at right-side region 256 of facial interface 210.

Facial interface 210 may be rotatable about the two facial-interface adjustment apparatuses 240 with respect to display housing 216 and display-viewing lenses 214. For example, facial interface 210 may be rotatable about an axis of rotation extending horizontally through each of the two facial-interface adjustment apparatuses 240 from the right side to the left side of head-mounted-display device 202. Accordingly, facial interface 210 may be rotatably adjusted such that upper region 252 of facial interface 210 is rotated toward and away from display housing 216 as lower region 254 of facial interface 210 is rotated toward and away from display housing 216. For example, upper region 252 of facial interface 210 may be rotated toward an upper portion of display housing 216 in conjunction with rotation of lower region 254 of facial interface 210 away from a lower portion of display housing 216 and vice-versa. Accordingly, a position and angular orientation of facial interface 210 with respect to display housing 216, display-viewing lenses 214, and other components of head-mounted-display device 202, may be adjusted by rotating facial interface 210. Display-viewing lenses 214 may be secured to display components of head-mounted-display device 202 such that display-viewing lenses 214 do not move in conjunction with facial interface 210. In some embodiments, facial interface 210 may rotate at least partially around display-viewing lenses 214 during rotational adjustment of facial interface 210.

Facial-interface adjustment apparatuses 240 may include any suitable components for rotationally adjusting facial interface 210 with respect to various portions of head-mounted-display device 202. For example, facial-interface adjustment apparatuses 240 may each include a pivot and/or a virtual pivot that allows for rotation of facial interface 210 about an axis of rotation 248 in rotational directions R1 and R2 shown in FIGS. 3, 5A, and 5B. In some embodiments, each facial-interface adjustment apparatus 240 may include a pivot member 242 coupled to a portion of back piece 238 of facial interface 210. For example, as shown in FIG. 2, a pivot member 242 may extend from an outward facing portion of back piece 238 on right-side region 256 of facial interface 210 toward a right-side region of display housing 216. The other pivot member 242 (see, e.g., FIG. 3) may extend from an outward facing portion of back piece 238 on left-side region 258 of facial interface 210 toward a left-side region of display housing 216. Each pivot member 242 may extend from back piece 238 along axis of rotation 248 toward display housing 216. Pivot members 242 may be integrally formed with back piece 238 of facial interface 210. In some embodiments, pivot members 242 may be bonded, fastened, and/or otherwise attached to back piece 238 of facial interface 210.

Each pivot member 242 may be rotatably coupled to a corresponding interface-mounting member 244 that is coupled to an interior of display housing 216. For example, interface-mounting member 244 shown in FIG. 2 may extend from interior surface 236 at a right-side region of display housing 216 that is adjacent to pivot member 242 disposed on right-side region 256 of facial interface 210. Interface-mounting members 244 may be integrally formed with display housing 216. In some embodiments, interface-mounting members 244 may be bonded, fastened, and/or otherwise attached to display housing 216. In some embodiments, at least one pivot member 242 may be rotatably disposed within a recess (e.g., coupling recess 245 shown in FIG. 3) defined within interface-mounting member 244. In at least one embodiment, pivot members 242 on opposite sides of facial interface 210 may be disposed within interface-mounting members 244 on opposite sides of display housing 216 such that facial interface 210 is securely and rotatably held within display housing 216. Additionally or alternatively, at least one interface-mounting member 244 may protrude from interior surface 236 of display housing 216 into a corresponding coupling recess of facial interface 210, such as a coupling recess defined in pivot member 242 protruding from back piece 238.

FIGS. 3 and 4 illustrate side views of head-mounted-display system 200. As shown in these figures, strap assembly 206 of head-mounted-display system 200 may include an upper strap 218 extending between upper back-strap portion 223 and strap-attachment loop 234 on upper region 252 of facial interface 210. For example, a portion of upper strap 218 may be looped through strap-attachment loop 234 to secure upper strap 218 to facial interface 210. As shown in FIGS. 3 and 4, upper strap 218 may include a strap-attachment portion 250 that is folded back and attached to another portion of upper strap 218. For example, strap-attachment portion 250 may be releasably attached to another adjacent portion of upper strap 218 via fabric hook and loop fasteners (e.g., VELCRO fasteners). Upper strap 218 may be flexible so as to conform to a contour of an upper portion of a user's head. In some examples, lower straps 220, lower back-strap portion 222, and/or upper back-strap portion 223 may include rigid and/or semi-rigid materials having less flexibility than upper strap 218. For example, lower straps 220, lower back-strap portion 222, and/or upper back-strap portion 223 may be formed of semi-rigid materials (e.g., semi-rigid polymers, fabrics, and/or other suitable materials) allowing for conformation of lower straps 220, lower back-strap portion 222, and/or upper back-strap portion 223 to portions of a user's head, including side and back portions of the head. While lower straps 220, lower back-strap portion 222, and/or upper back-strap portion 223 may have suitable flexibility for adjusting to a user's head shape and size, lower straps 220, lower back-strap portion 222, and/or upper back-strap portion 223 may have sufficient rigidity to provide support for head-mounted-display device 202 on the user's head. In at least one embodiment, lower straps 220 may each include a strap-adjustment member 230 that is formed of a rigid material (e.g., a rigid polymer, metal, and/or other suitable material) that provides additional support for head-mounted-display device 202 at a connection region between head-mounted-display device 202 (e.g., strap-holding member 232 shown in FIG. 2) and strap-adjustment member 230 of each lower strap 220.

In some embodiments, lower straps 220 may secure display housing 216 and portions of head-mounted-display device 202 disposed in display housing 216 (e.g., image display components and display-viewing lenses 214) in a selected position and orientation on a user's head. Additionally, facial interface 210 may be rotatable relative to display housing 216 and the portions of head-mounted-display device 202 disposed in display housing 216 such that facial interface 210 rotates to abut and/or conform to a surface profile of the user's face. Facial interface 210 may rotate independently of lower straps 220 such that the position and orientation of facial interface 210 are determined by the user's facial features. Accordingly, an orientation of display housing 216 and portions of head-mounted-display device 202 disposed in display housing 216 (e.g., image display components and display-viewing lenses 214) may be based on back, side, and/or upper features of a user's head abutting lower straps 220, lower back-strap portion 222, and/or upper back-strap portion 223, while an orientation of facial interface 210 may be based on the user's facial features abutting facial interface 210. The locations and orientations of facial interface 210 and display housing 216 may be held in place relative to the user's head when strap assembly 206 is tightened to secure strap assembly 206 on the user's head.

FIG. 3 illustrates a facial-interface adjustment apparatus 240 located in a left side of head-mounted-display device 202. For example, facial-interface adjustment apparatus 240 may be positioned between left-side region 258 of facial interface 210 and a left side region of display housing 216. Pivot member 242, which is attached to back piece 238 of facial interface 210, may be rotatably coupled to interface-mounting member 244, which is attached to display housing 216, in any suitable manner. For example, pivot member 242 may include a protrusion that is disposed within a coupling recess defined in a portion of display housing 216, such as a coupling recess 245 defined within interface-mounting member 244 such that pivot member 242 is rotatable within coupling recess 245 in rotational directions R1 and R2 about axis of rotation 248. In some embodiments, pivot member 242 may have an arcuate external surface shape (e.g., a cylindrical or partial cylindrical surface) that corresponds to an arcuate internal surface shape defined by coupling recess 245 in interface-mounting member 244, enabling rotation of pivot member 242 within interface-mounting member 244. Additionally or alternatively, interface-mounting member 244 may protrude from interior surface 236 of display housing 216 into a corresponding coupling recess of facial interface 210, such as a coupling recess defined in pivot member 242 protruding from back piece 238.

According to some embodiments, as shown in FIG. 3, one or more of facial-interface adjustment apparatuses 240 may include an inner coupling member 247 protruding from interior surface 236 of display housing 216 along axis of rotation 248 into an inner coupling recess 249 defined within pivot member 242. Inner coupling member 247 may be integrally formed with display housing 216. In some embodiments, inner coupling member 247 may be bonded, fastened, and/or otherwise attached to display housing 216. Inner coupling member 247 may further secure facial interface 210 to display housing 216 and may facilitate rotation of facial interface 210 with respect to display housing 216. In at least one embodiment, pivot member 242 may be rotatable relative to display housing 216 between interface-mounting member 244 and inner coupling member 247. In some embodiments, inner coupling member 247 may have an arcuate external surface shape (e.g., a cylindrical or partial cylindrical surface) that corresponds to an arcuate internal surface shape defining inner coupling recess 249 in pivot member 242, enabling rotation of pivot member 242 about inner coupling member 247. In at least one embodiment, each inner coupling member 247 may comprise two more protrusions extending from interior surface 236 of display housing 216 into inner coupling recess 249 defined in pivot member 242. For example, as shown in FIG. 3, inner coupling member 247 may include two protrusions having opposite facing arcuate surface portions abutting an interior surface of pivot member 242. The two protrusion of inner coupling member 247 may apply an outward biasing force toward inner surface portions of pivot member 242 to further secure pivot member 242 to inner coupling member 247.

FIG. 4 illustrates adjustment of strap assembly 206 with respect to head-mounted-display device 202. In some embodiments, lower straps 220 of strap assembly 206 may be moved in direction D1 toward head-mounted-display device 202 and in direction D2 away from head-mounted-display device 202. Strap-adjustment members 230 of lower straps 220 may be moved between a plurality of positions in directions D1 and D2 with respect to head-mounted-display device 202. For example, strap-adjustment members 230 may be moved between a plurality of positions by sliding each strap-adjustment member 230 into and out of a corresponding strap-holding member (e.g., strap-holding member 232 shown in FIG. 2) of head-mounted-display device 202. Strap-adjustment members 230 may be held within each of the plurality of positions following adjustment. Upper strap 218 may also be lengthened and shortened by releasing strap-attachment portion 250 from an abutting portion of upper strap 218, adjusting upper strap 218 to a desired length, and reattaching strap-attachment portion 250 to another abutting portion of upper strap 218.

In some embodiments, a user may mount and secure head-mounted-display system 200 to his or her head by extending lower straps 220 of strap assembly 206 in direction D2 and lengthening upper strap 218 such that head-mounted-display system 200 is larger than his or her head. The user may then place head-mounted-display system 200 on his or her head in a desired position and orientation and may move lower straps 220 in direction D1 to tighten strap assembly 206 such that lower back-strap portion 222 and upper back-strap portion 223 securely abut a back portion of the user's head, such that lower straps 220 securely abut side portions of the user's head, and such that facial interface 210 securely abuts the user's face surrounding the user's field of vision. The user may adjust lower straps 220 until a comfortable and secure fit is obtained. As strap assembly 206 is tightened against the user's head, facial interface 210 may rotate in rotational direction R1 or rotational direction R2 such that facial interface 210 is comfortably oriented and positioned against portions of the user's face. As facial interface 210 rotates relative to display housing 216, the user's eyes may be maintained at a desired position and/or orientation relative to display-viewing lenses 114 (see, e.g., FIG. 2) and other display components of head-mounted-display device 202 such that an optimal viewing position for the user to view display regions of head-mounted-display device 202 is provided. The user may then shorten upper strap 218 such that upper strap 218 is secured against an upper portion of the user's head and reattach strap-attachment portion 250 to an adjacent portion of upper strap 218 to maintain the desired length and fit of upper strap 218.

Figure 5A:
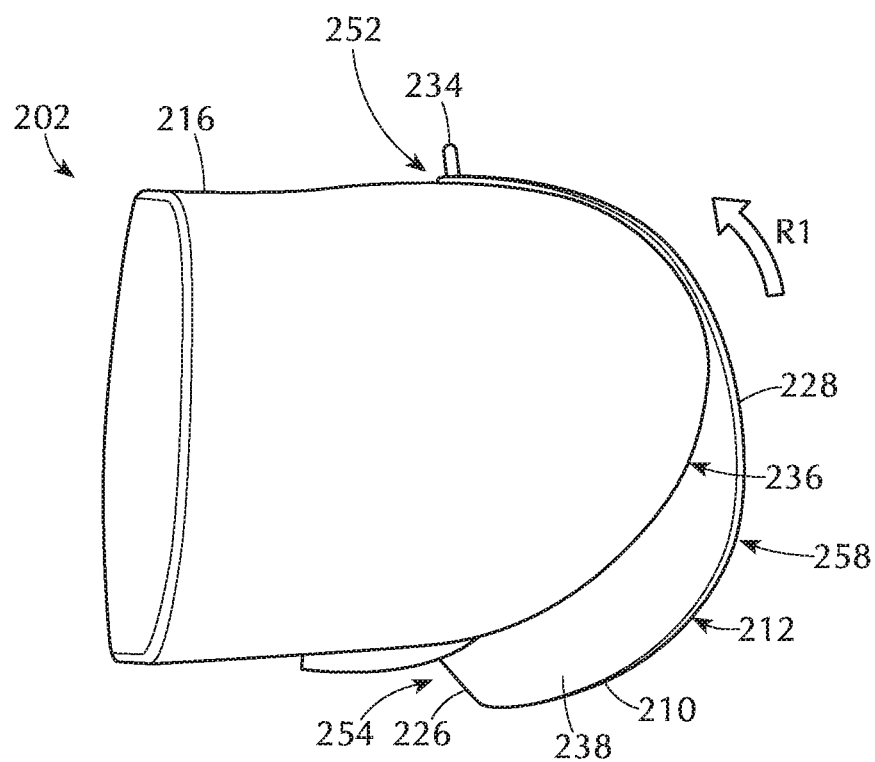
FIGS. 5A and 5B are side views of an exemplary head-mounted-display device in accordance with some embodiments.
Figure 5B:
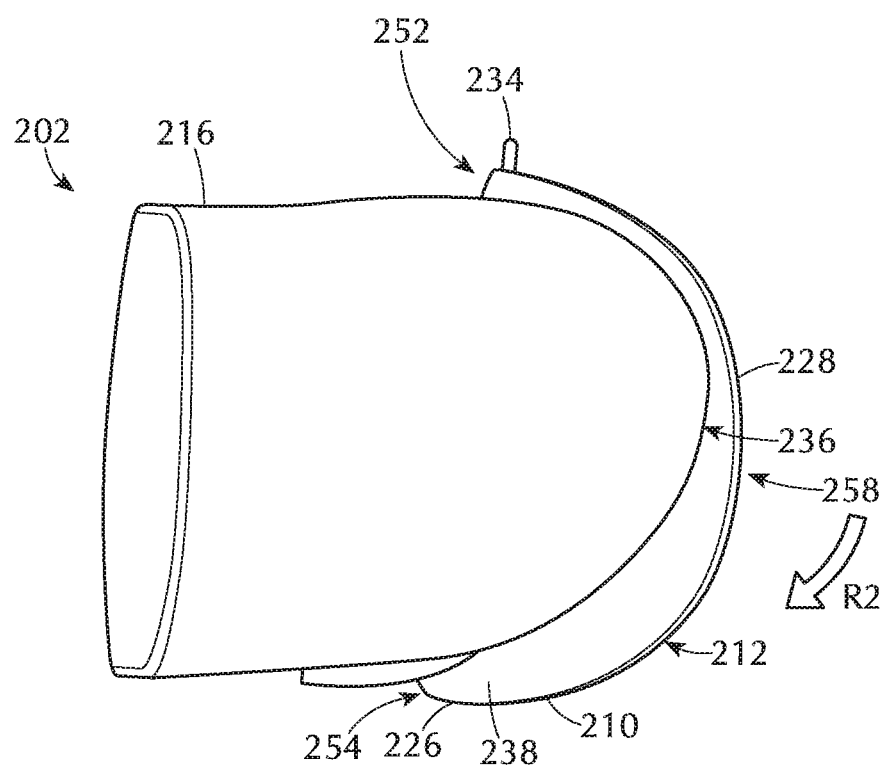

FIGS. 5A and 5B show side views of head-mounted-display device 202 with facial interface 210 disposed in exemplary positions relative to display housing 216. In at least one embodiment, facial interface 210 may be rotated in rotational direction R1 to the position shown in FIG. 5A. Facial interface 210 may then be rotated in rotational direction R2 from the position shown in FIG. 5A to the position shown in FIG. 5B. Facial interface 210 may be disposed in any one of a plurality of other positions relative to display housing 216 and other components of head-mounted-display device 202 (e.g., display-viewing lenses 214 and strap-holding member 232 shown in FIG. 2, various display components of head-mounted-display device 202, and/or other components of head-mounted-display device 202). In some embodiments, resilient light-blocking layer 246 (see, e.g., FIG. 2) may flex and/or stretch between a portion of facial interface 210 (e.g., back piece 238 shown in FIG. 2) and display-viewing lenses 214 in conjunction with movement of facial interface 210 so as to block external light and maintain an enclosed viewing region 212.

Figure 6:
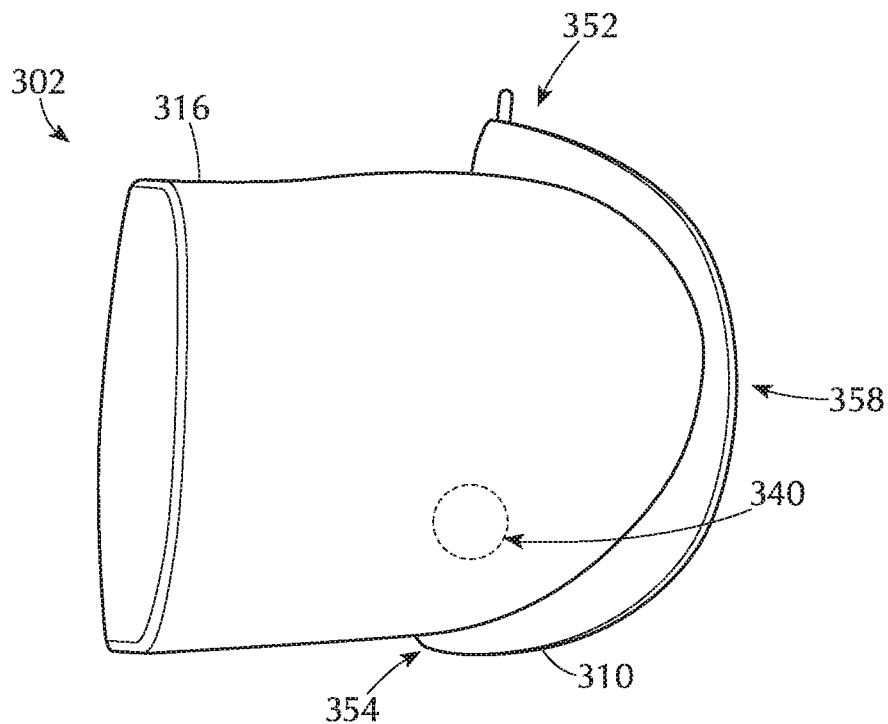
FIG. 6 is a side view of an exemplary head-mounted-display device in accordance with some embodiments.
Figure 7:
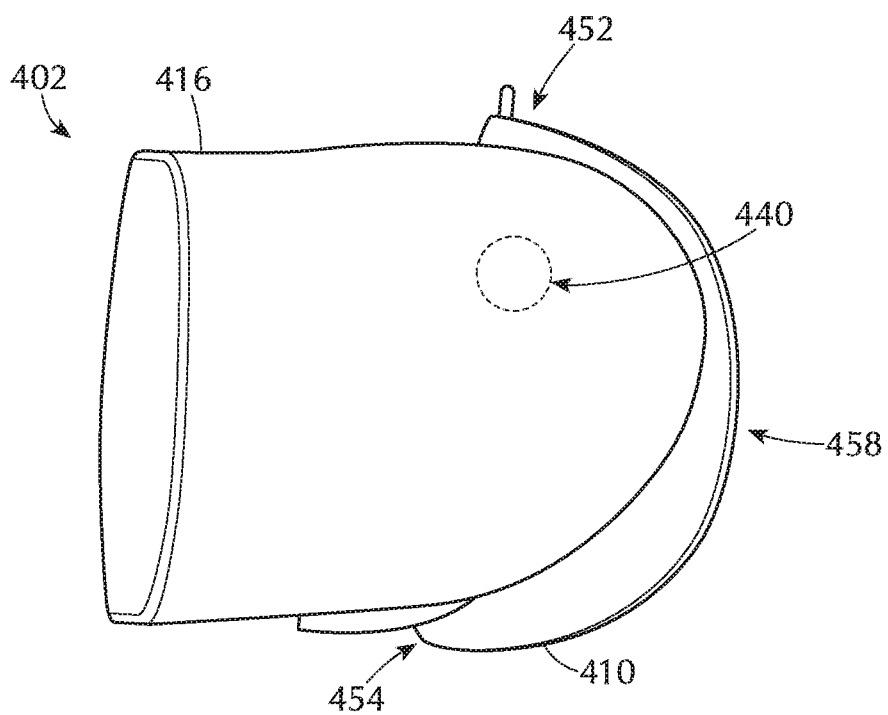
FIG. 7 is a side view of an exemplary head-mounted-display device in accordance with some embodiments.

FIGS. 6 and 7 show side views of exemplary head-mounted-display devices having facial-interface adjustment apparatuses that are disposed in various configurations. FIG. 6 shows a head-mounted-display device 302 having a facial interface 310 that is rotatably coupled to a display housing 316 by at least one facial-interface adjustment apparatus 340. An upper region 352, lower region 354, and left-side region 358 of facial interface 310 are shown in FIG. 6. In some embodiments, each facial-interface adjustment apparatus 340 may be disposed at a region of display housing 316 and facial interface 310 that is lower than facial-interface adjustment apparatus 240 shown in FIGS. 2 and 3. In at least one embodiment, two facial-interface adjustment apparatuses 340 may be disposed at or near a nasal region of facial interface 310 (e.g., nasal region nasal region 259 shown in FIG. 2). In some embodiments, each facial-interface adjustment apparatus 340 may be disposed between facial interface 310 and an adjacent portion of display housing 316. Each facial-interface adjustment apparatus 340 may include any of the features disclosed herein in relation to facial-interface adjustment apparatus 240 (see, e.g., FIGS. 2-5B) and/or any other suitable features, enabling rotation of facial interface 310 with respect to display housing 316 and/or any other suitable components of head-mounted-display device 302.

FIG. 7 shows a head-mounted-display device 402 having a facial interface 410 that is rotatably coupled to a display housing 416 by at least one facial-interface adjustment apparatus 440. An upper region 452, lower region 454, and left-side region 458 of facial interface 410 are shown in FIG. 7. In some embodiments, each facial-interface adjustment apparatus 440 may be disposed at a region of display housing 416 and facial interface 410 that is higher than facial-interface adjustment apparatus 240 shown in FIGS. 2 and 3. According to some embodiments, two facial-interface adjustment apparatuses 440 may be disposed at or near a temple and/or forehead region of facial interface 410. In some embodiments, each facial-interface adjustment apparatus 440 may be disposed between facial interface 410 and an adjacent portion of display housing 416. Each facial-interface adjustment apparatus 440 may include any of the features disclosed herein in relation to facial-interface adjustment apparatus 240 (see, e.g., FIGS. 2-5B) and/or any other suitable features, enabling rotation of facial interface 410 with respect to display housing 416 and/or any other suitable components of head-mounted-display device 402.

Figure 8:
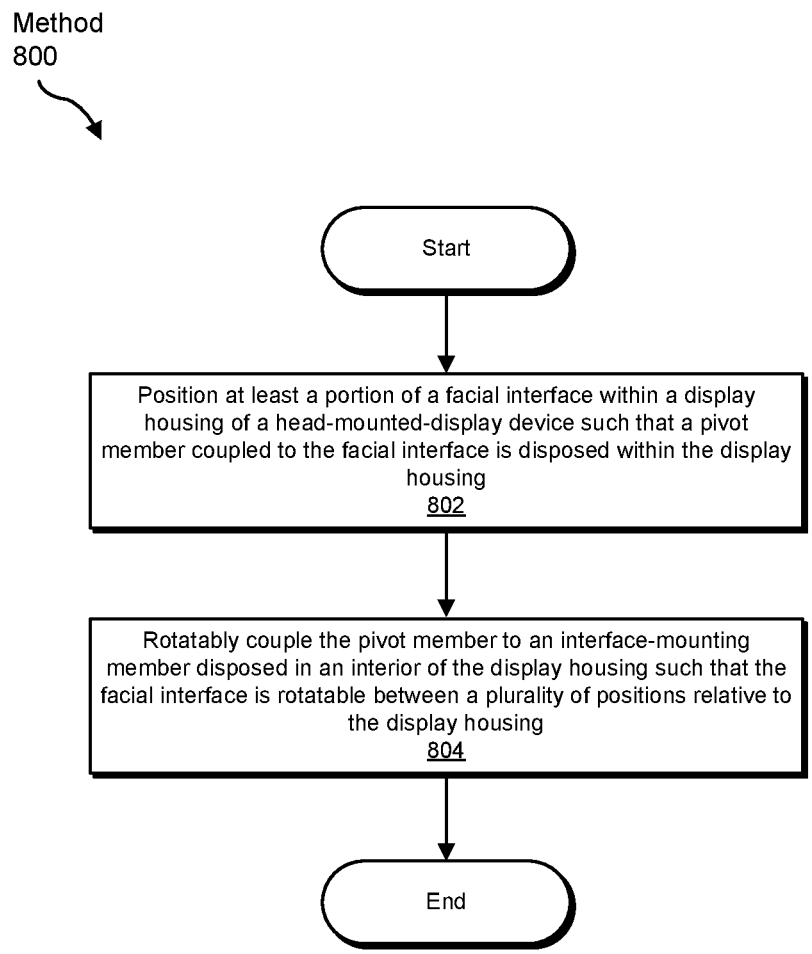
FIG. 8 is a block diagram of an exemplary method for assembling a facial-interface system for a head-mounted display in accordance with some embodiments.

FIG. 8 is a flow diagram of an exemplary method 800 for assembling a head-mounted-display device according to any of the embodiments disclosed herein. The steps shown in FIG. 8 may be performed by an individual and/or by any suitable manual and/or automated apparatus.

At step 802 in FIG. 8, at least a portion of a facial interface may be positioned within a display housing of a head-mounted-display device such that a pivot member coupled to the facial interface is disposed within the display housing. For example, at least a portion of facial interface 210 may be positioned within display housing 216 of head-mounted-display device 202 such that pivot member 242 coupled to facial interface 210 is disposed within display housing 216 (see, e.g., FIGS. 2-5B; see also, FIGS. 6 and 7).

At step 804 in FIG. 8, the pivot member may be rotatably coupled to an interface-mounting member disposed in an interior of the display housing such that the facial interface is rotatable between a plurality of positions relative to the display housing. For example, pivot member 242 may be rotatably coupled to interface-mounting member 244 disposed in an interior of display housing 216 such that facial interface 210 is rotatable between a plurality of positions relative to display housing 216 (see, e.g., FIGS. 2, 3, 5A, and 5B).

As discussed throughout the instant disclosure, the disclosed methods, systems, and devices may provide one or more advantages over traditional facial-interface systems and head-mounted displays. For example, the disclosed facial-interface systems may enable users to quickly and easily adjust facial interfaces automatically while securing head-mounted-display systems to their heads. The facial-interface systems may include facial-interface adjustment apparatuses that enable users to adjust the positions and orientations of facial interfaces on head-mounted displays. The facial interfaces of the head-mounted displays may automatically rotate and adjust to users' unique facial contours as the users place the facial interfaces against their faces and tighten holding strap assemblies to secure the head-mounted displays on their heads. The facial-interface systems may thus enable users to position the facial interfaces so as to comfortably fit head-mounted displays to various user face sizes and shapes. The head-mounted displays may include resilient light-blocking layers that flex and stretch as the facial-interfaces are moved between various positions with respect to the display-viewing lenses, ensuring that external light is blocked from entering user viewing regions of the head-mounted displays during use. Accordingly, the facial-interface systems may allow users to automatically adjust and comfortably wear head-mounted displays without having to replace the facial interfaces and/or interface cushions. Additionally, the facial-interface systems may provide users with an optimal viewing position for viewing display regions of the head-mounted displays, ensuring a high-quality viewing experience for the users.

The foregoing description, for purposes of explanation, has been described with reference to specific embodiments and has been provided to enable others skilled in the art to best utilize various aspects of the example embodiments disclosed herein. However, the illustrative discussions above are not intended to be exhaustive or to limit the scope of the claims to the precise forms disclosed. Many modifications and variations are possible in view of the above teachings without departing from the spirit and scope of the instant disclosure. The instant disclosure covers all modifications, equivalents, and alternatives falling within the scope of the appended claims. Features from any of the above-mentioned embodiments may be used in combination with one another in accordance with the general principles described herein. The embodiments were chosen to best explain the principles underlying the claims and their practical applications, to thereby enable others skilled in the art to best use the embodiments with various modifications as are suited to the particular uses contemplated. The embodiments disclosed herein should be considered in all respects illustrative and not restrictive. Reference should be made to the appended claims and their equivalents in determining the scope of the instant disclosure.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

It will also be understood that, although the terms first, second, etc. are, in some instances, used herein to describe various elements, these elements should not be limited by these terms. These terms are used only to distinguish one element from another. For example, a first segment could be termed a second segment, and, similarly, a second segment could be termed a first segment, without departing from the scope of the various described embodiments. The first segment and the second segment are both segments, but they are not the same segment.

The terminology used in the description of the various described embodiments herein is for the purpose of describing particular embodiments only and is not intended to be limiting. As used in the description of the various described embodiments and the appended claims, the singular forms "a," "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. The term "exemplary" is used herein in the sense of "serving as an example, instance, or illustration" and not in the sense of "representing the best of its kind." Unless otherwise noted, the terms "connected to," "coupled to," and "attached to" (and their derivatives), as used in the specification and claims, are to be construed as permitting both direct and indirect (i.e., via other elements or components) connection. Furthermore, two or more elements may be coupled together with an adhesive, a clasp, a latch, a hook, a link, a buckle, a bolt, a screw, a rivet, a snap, a catch, a lock, or any other type of fastening or connecting mechanism.

What is claimed is:

1. A facial-interface system for a head-mounted-display device comprising:
    a facial interface; and
    a facial-interface adjustment apparatus comprising:
        an interface-mounting member for mounting the facial-interface adjustment apparatus to a display housing; and
        a pivot member coupled to the display housing and rotatably coupled to the interface-mounting member such that that the display housing is rotatable between a plurality of positions relative to the facial interface.

2. The facial-interface system of claim 1, wherein the facial interface comprises an upper region dimensioned to abut a user's forehead and a lower region dimensioned to abut the user's nose.

3. The facial-interface system of claim 2, wherein the pivot member is coupled to the facial interface at a location between the upper region and the lower region.

4. The facial-interface system of claim 2, wherein the pivot member is coupled to the facial interface at the lower region.

5. The facial-interface system of claim 1, wherein the pivot member comprises a protrusion that extends into a recess defined in the interface-mounting member.

6. The facial-interface system of claim 1, wherein the interface-mounting member comprises a protrusion that extends into a recess defined in the pivot member.

7. The facial-interface system of claim 1, wherein:
    the facial interface comprises:
        an interface cushion dimensioned to abut a user's face; and
        a back piece protruding away from the interface cushion; and
    the pivot member is coupled to the back piece.

8. The facial-interface system of claim 7, wherein:
    the back piece of the facial interface comprises an inner surface facing toward a viewing region and an outer surface facing away from the viewing region; and
    the pivot member extends from the outer surface of the back piece.

9. The facial-interface system of claim 1, further comprising two facial-interface adjustment apparatuses, each of the two facial-interface adjustment apparatuses comprising:

an interface-mounting member for mounting the facial-interface adjustment apparatus to the display housing; and a pivot member coupled to a corresponding interface-mounting member.

10. The facial-interface system of claim 9, wherein the pivot members of the two facial-interface adjustment apparatuses each extend from opposite facing surface portions of the interface-mounting member.

11. A head-mounted-display device comprising:
a facial interface;
a display housing; and
a facial-interface adjustment apparatus comprising:
an interface-mounting member disposed in an interior of the display housing; and
a pivot member coupled to the display housing and rotatably coupled to the interface-mounting member such that that the display housing is rotatable between a plurality of positions relative to the facial interface.

12. The head-mounted-display device of claim 11, wherein:
the facial interface comprises an upper region dimensioned to abut a user's forehead and a lower region dimensioned to abut the user's nose; and
the pivot member is coupled to the facial interface at a location between the upper region and the lower region.

13. The head-mounted-display device of claim 12, wherein the upper region of the facial interface is rotatable toward the display housing in conjunction with rotation of the lower region of the facial interface away from the display housing.

14. The head-mounted-display device of claim 11, wherein:
the facial interface comprises:
an interface cushion dimensioned to abut a user's face; and
a back piece protruding into the display housing; and
the pivot member is coupled to the back piece.

15. The head-mounted-display device of claim 14, further comprising a resilient light-blocking layer coupled to the back piece of the facial interface.

16. The head-mounted-display device of claim 15, further comprising a display viewing lens, wherein the resilient light-blocking layer extends between the back piece of the facial interface and the display viewing lens.

17. The head-mounted-display device of claim 15, wherein the resilient light-blocking layer comprises a resilient fabric layer.

18. The head-mounted-display device of claim 11, further comprising two facial-interface adjustment apparatuses, each of the two facial-interface adjustment apparatuses comprising:
an interface-mounting member coupled to an interior surface portion of the display housing; and
a pivot member coupled to a corresponding interface-mounting member.

19. The head-mounted-display device of claim 18, wherein the pivot members of the two facial-interface adjustment apparatuses are rotatable about a common axis of rotation relative to the interface-mounting members.

20. A method comprising:
positioning at least a portion of a facial interface within a display housing of a head-mounted-display device such that a pivot member is coupled to the display housing; and
rotatably coupling the pivot member to an interface-mounting member disposed in an interior of the display housing such that the display housing is rotatable between a plurality of positions relative to the facial interface.

* * * * *